United States Patent
Matthe et al.

(10) Patent No.: US 8,994,340 B2
(45) Date of Patent: Mar. 31, 2015

(54) CELL TEMPERATURE AND DEGRADATION MEASUREMENT IN LITHIUM ION BATTERY SYSTEMS USING CELL VOLTAGE AND PACK CURRENT MEASUREMENT AND THE RELATION OF CELL IMPEDANCE TO TEMPERATURE BASED ON SIGNAL GIVEN BY THE POWER INVERTER

(75) Inventors: Roland Matthe, Bischofsheim (DE); Hans-Joachim Humbert, Mainz (DE); Konrad Kowalczyk, Floersheim (DE)

(73) Assignee: GM Global Technology Operations LLC, Detroit, MI (US)

( * ) Notice: Subject to any disclaimer, the term of this patent is extended or adjusted under 35 U.S.C. 154(b) by 401 days.

(21) Appl. No.: 13/471,803

(22) Filed: May 15, 2012

(65) Prior Publication Data
US 2013/0307487 A1 Nov. 21, 2013

(51) Int. Cl.
*H02J 7/00* (2006.01)
*G05F 3/02* (2006.01)

(52) U.S. Cl.
CPC .... *H02J 7/00* (2013.01); *G05F 3/02* (2013.01)
USPC ........... 320/153; 320/104; 320/112; 320/126; 320/134; 320/136; 320/144; 320/159; 320/152; 320/162; 307/150

(58) Field of Classification Search
CPC ..................................... H02J 7/00; G05F 3/02
USPC ......... 320/153, 104, 112, 126, 134, 136, 144, 320/159, 152, 162; 307/150
See application file for complete search history.

(56) References Cited

U.S. PATENT DOCUMENTS

| | | | | |
|---|---|---|---|---|
| 5,640,077 A * | 6/1997 | Gillissen et al. | ............... | 320/150 |
| 6,107,780 A * | 8/2000 | Kellerman | ..................... | 320/132 |
| 7,362,074 B2 * | 4/2008 | Iwane et al. | .................. | 320/132 |
| 7,626,394 B2 * | 12/2009 | Kimura et al. | ................ | 324/427 |
| 8,432,168 B2 * | 4/2013 | Kawase | ........................ | 324/430 |
| 8,570,046 B2 * | 10/2013 | Hart et al. | ..................... | 324/430 |
| 8,766,566 B2 * | 7/2014 | Baba et al. | .................... | 318/139 |
| 2007/0259256 A1 * | 11/2007 | Le Canut et al. | ............... | 429/90 |
| 2008/0120050 A1 * | 5/2008 | Iwane et al. | ..................... | 702/63 |
| 2008/0136378 A1 * | 6/2008 | Iwahana et al. | ................ | 320/153 |
| 2009/0243538 A1 * | 10/2009 | Kelty et al. | .................... | 320/104 |
| 2010/0045298 A1 * | 2/2010 | Iwane et al. | .................. | 324/427 |
| 2010/0250038 A1 * | 9/2010 | Morita et al. | ................... | 701/22 |
| 2011/0077879 A1 * | 3/2011 | Paryani | ............................ | 702/63 |
| 2011/0210703 A1 * | 9/2011 | Souza et al. | ................. | 320/136 |
| 2012/0025786 A1 * | 2/2012 | Heizer et al. | .................. | 320/160 |

* cited by examiner

*Primary Examiner* — Phallaka Kik
(74) *Attorney, Agent, or Firm* — John A. Miller; Miller IP Group, PLC

(57) ABSTRACT

A method and system for determining the temperature of cells in a battery pack, without using temperature sensors, by measuring the impedance of the cells and using the impedance to determine the temperature. An AC voltage signal is applied to the battery pack, and a time sample of voltage and current data is obtained. The voltage and current data is narrowed down to a simultaneous time window of interest, and a fast fourier transformation is performed on the windowed voltage and current data to identify voltage and current magnitudes at one or more specific frequencies. The voltage and current magnitudes are used to determine the impedance at the one or more frequencies. Finally, the impedance is used to determine the temperature of the cell or cells using a look-up table, where the impedance, the frequency, and a state of charge are used as input parameters for the look-up.

17 Claims, 4 Drawing Sheets

CELL TEMPERATURE AND DEGRADATION MEASUREMENT IN LITHIUM ION BATTERY SYSTEMS USING CELL VOLTAGE AND PACK CURRENT MEASUREMENT AND THE RELATION OF CELL IMPEDANCE TO TEMPERATURE BASED ON SIGNAL GIVEN BY THE POWER INVERTER

BACKGROUND OF THE INVENTION

1. Field of the Invention

This invention relates generally to cell temperature measurement in a battery pack and, more particularly, to a method and system for determining the temperature of cells in a battery pack which does not require temperature sensors, but rather determines impedance of each cell under application of an AC voltage signal at a given frequency and uses the impedance along with a state of charge to determine the temperature of the cell.

2. Discussion of the Related Art

Electric vehicles and gasoline-electric or diesel-electric hybrid vehicles are rapidly gaining popularity in today's automotive marketplace. Electric and hybrid-electric vehicles offer several desirable features, such as reducing or eliminating emissions and petroleum-based fuel consumption at the consumer level, and potentially lower operating costs. A key subsystem of electric and hybrid-electric vehicles is the battery pack, which can represent a substantial proportion of the vehicle's cost. Battery packs in these vehicles typically consist of numerous interconnected cells, which are able to deliver a lot of power on demand. Maximizing battery pack performance and life are key considerations in the design and operation of electric and hybrid electric vehicles.

A typical electric vehicle battery pack includes one or more battery pack sections, with each section containing numerous cells in series to provide the required voltage. In order to optimize the performance and durability of the battery pack, it is important to monitor the temperature of the cells. It is not feasible or too costly to measure the temperature of each individual cell, so there are typically a few temperature sensors situated in scattered locations throughout the battery pack. These temperature sensors only measure surface temperature of cells, so data from the temperature sensors can only be used to determine an average battery pack temperature, and to identify any abnormally high or low temperatures that may occur.

While the use of traditional temperature sensors is well known and reasonably effective, problems can occur if any of the temperature sensors fail. Such failures could lead to inaccurate temperature readings, which may diminish battery pack performance. Failures can also require service visits for the vehicle, in order to replace the defective component. In addition, there is a practical limit to the number of temperature sensors which can be provided in a battery pack. Therefore, the temperature of each individual cell can only be estimated. Also, temperature sensor hardware adds to the cost of the overall system.

There is a need for a battery pack cell temperature measurement method which does not require physical temperature sensors. Such a method could reduce cost by eliminating the temperature sensors, improve reliability by avoiding replacement of failed temperature sensors, and improve battery pack performance and durability by providing temperature data for each cell rather than at just a few points in a battery pack.

SUMMARY OF THE INVENTION

In accordance with the teachings of the present invention, a method and system are disclosed for determining the temperature of cells in a battery pack, without using temperature sensors, by measuring the impedance of the cells and using the impedance to determine the temperature. An AC voltage signal is applied to the battery pack, and a time sample of voltage and current data is obtained. The voltage and current data is narrowed down to a simultaneous time window of interest, and a fast fourier transformation is performed on the windowed voltage and current data to identify voltage and current magnitudes at one or more specific frequencies. The voltage and current magnitudes are used to determine the impedance at the one or more frequencies. Finally, the impedance is used to determine the temperature of the cell or cells using a look-up table, where the impedance, the frequency, and a state of charge are used as input parameters for the look-up.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method and system for battery pack cell temperature determination via impedance measurement is merely exemplary in nature, and is in no way intended to limit the invention or its applications or uses. For example, the discussion that follows is directed to cell temperature measurement in electric vehicle battery packs, but the method is equally applicable to battery packs in other vehicular and non-vehicular applications.

Battery packs in electric vehicles and gasoline-electric or diesel-electric hybrid vehicles (hereinafter collectively referred to simply as "electric vehicles") typically consist of hundreds of individual cells. In one popular lithium-ion rechargeable battery chemistry, each cell produces approximately 3.7 volts nominally, with the exact value depending on state of charge and other factors. Many cells connected serially in a module provide the high voltage necessary to drive electric vehicle motors, while multiple cells can be arranged in parallel in a cell group to increase capacity.

Figure 1:
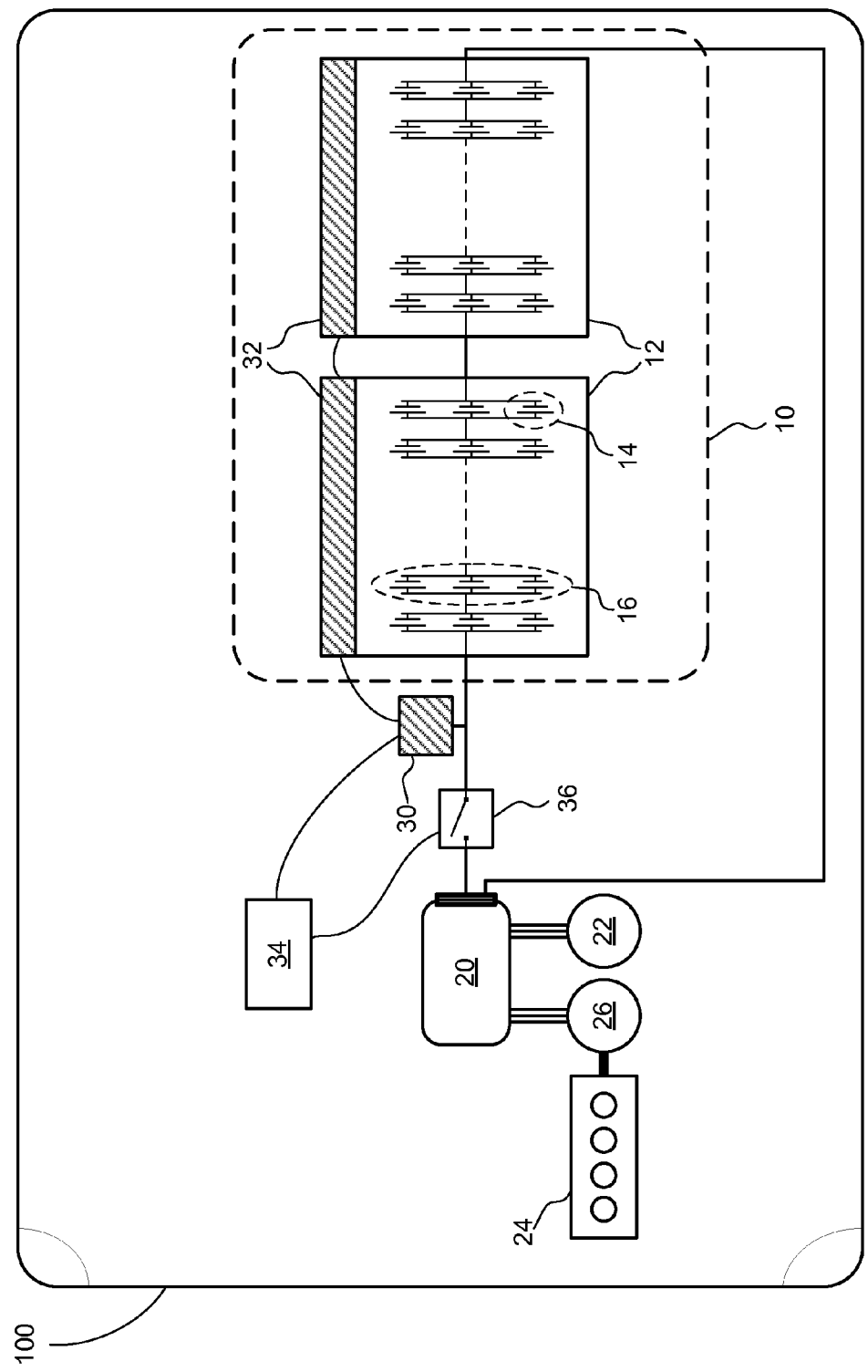
FIG. 1 is a schematic diagram of a hybrid-electric vehicle battery pack and related components which illustrates both a traditional method of battery pack temperature measurement and a new method.

FIG. 1 is a schematic diagram of a hybrid-electric vehicle 100 including a battery pack 10 and related components, which illustrates both a traditional method of battery pack temperature measurement and how a new method could be implemented. A battery pack such as the battery pack 10 typically consists of one or more sections 12, with each of the sections 12 containing many individual battery cells 14. In one popular architecture, more than one of the cells 14 are connected in parallel in a cell group 16. In the battery pack 10 specifically, three of the cells 14 are contained in each of the cell groups 16.

The battery pack 10 provides energy to a traction inverter 20 which converts the direct current (DC) battery voltage to a three-phase alternating current (AC) signal which is used by a drive motor 22 to propel the vehicle 100. An engine 24 can be used to drive a generator 26, which in turn provides energy to recharge the battery pack 10 via the inverter 20. External (grid) power can also be used to recharge the battery pack 10 via circuitry which is not shown.

In a typical architecture, a voltage-current-temperature module (VITM) 30 monitors its namesake conditions for the battery pack 10. The VITM 30 communicates with voltage-temperature sub-modules (VTSMs) 32, where one VTSM 32 is provided for each of the sections 12. The VTSMs 32 monitor voltage across each of the cell groups 16, and temperature at various locations in each section 12, as discussed previously. The VTSM's 32 provide voltage and temperature data to the VITM 30, which additionally measures current flowing into or out of the battery pack 10. The VITM 30 provides voltage, current and temperature data to a battery controller 34, which monitors battery pack performance and controls battery pack operation. The battery controller 34 communicates with other controllers (not shown) in the vehicle 100 and controls operation of, among other things, a switch 36. Other hardware and circuitry, not relevant to the discussion, is omitted from FIG. 1.

As described above, in a typical battery pack architecture, the VTSMs 32 monitor temperature via temperature sensors (not shown) at various locations in the battery pack 10. The measured temperature data, along with voltage and current data, are then used by the battery controller 34 to assess conditions in the battery pack 10. However, as also mentioned previously, it is desirable to eliminate the temperature sensors and determine temperature in another way. As will be described in detail below, the impedance of each of the cell groups 16 can be measured and, using a known relationship between impedance and temperature, temperature can be determined for each of the cell groups 16. Impedance can be measured by applying an AC voltage signal to the battery pack 10, and measuring the battery pack current and the voltage across each of the cell groups 16. The AC voltage signal can conveniently be provided by the traction inverter 20.

Figure 2:
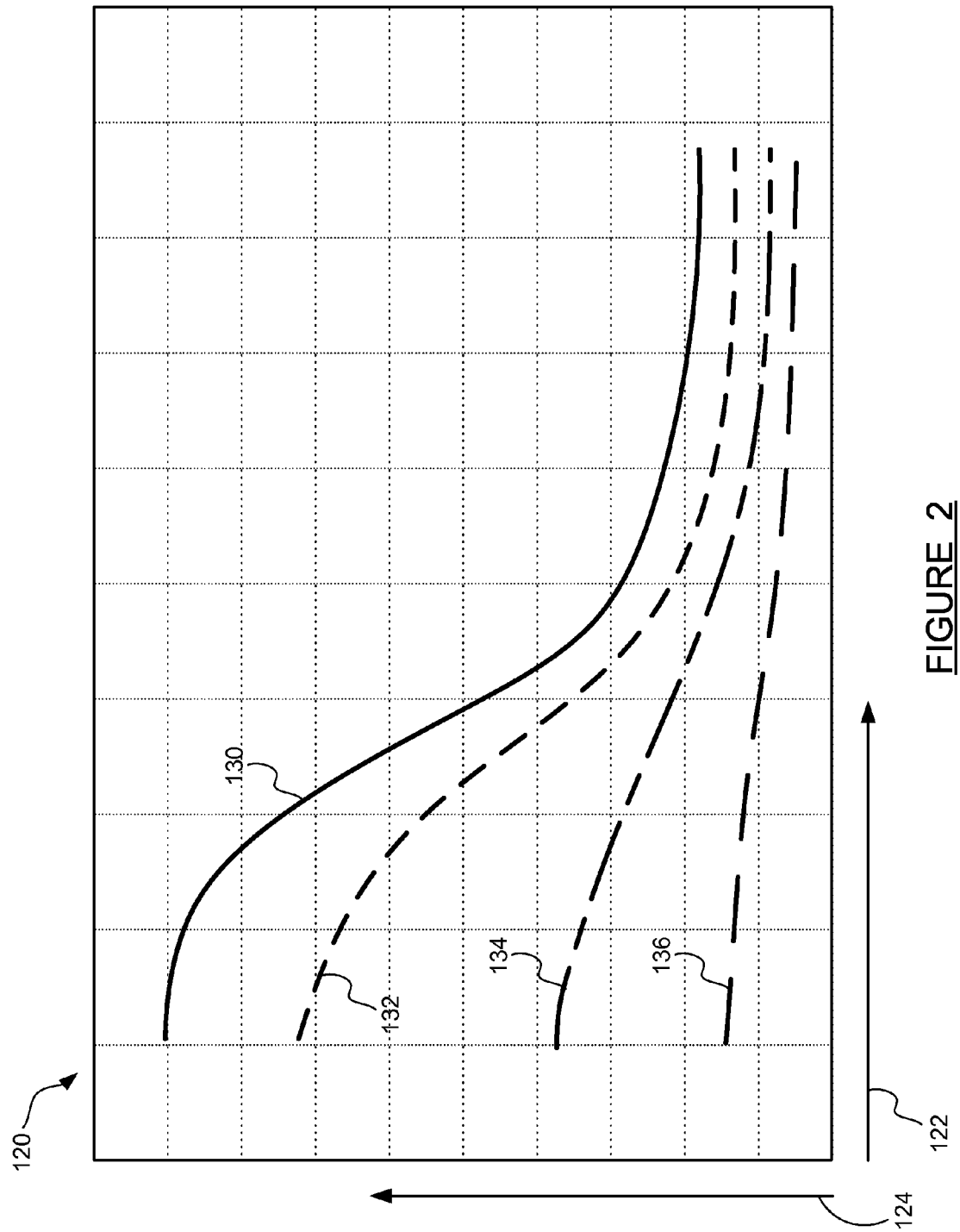
FIG. 2 is a graph of battery cell impedance as a function of input signal frequency for a variety of temperatures.

FIG. 2 is a graph 120 of battery cell impedance as a function of signal frequency for a variety of temperatures. In the graph 120, horizontal axis 122 represents frequency of an applied voltage signal, and vertical axis 124 represents impedance of a battery cell 14 or cell group 16. The horizontal axis 122 runs from a frequency of zero hertz (Hz), or direct current, to a frequency of about 10,000 Hz. The horizontal axis may conveniently show frequency on a log scale. The vertical axis 124 shows impedance of a battery cell 14 or cell group 16 in ohms or milliohms, with a maximum value typically being less than 20 milliohms.

Curve 130 represents impedance of the cell 14 at a temperature of −25° C. Curve 132 represents impedance of the cell 14 at a temperature of −10° C. Curve 134 represents impedance of the cell 14 at a temperature of 5° C. Curve 136 represents impedance of the cell 14 at a temperature of 25° C. The fact that impedance varies as a function of temperature, for a given signal frequency, can be used to determine temperature of a battery cell 14 or cell group 16 based on a measured impedance at a known frequency. In fact, impedance of the cell 14 also varies with state of charge. Therefore, in practice, a look-up table can be used to determine the temperature of the cell 14 which corresponds to the measured impedance at a known state of charge for a given frequency. The look-up table can be populated with data from laboratory testing of the cell 14 or the cell group 16. Thus, the data is all known in advance and can be programmed into, for example, the battery controller 34, where it can be used to look up temperature values during operation of the battery pack 10.

Given the relationship of impedance to temperature shown in the graph 120, it then becomes necessary to select an input signal frequency and devise a means of measuring impedance. It can be seen in the graph 120 that the variability of impedance with temperature is greatest at low frequencies. However, very low input signal frequencies may not be desirable for the purpose of measuring impedance because, at very low frequencies, a significant amount of charging and discharging energy is actually being applied to the battery pack 10. On the other hand, at very high frequencies, there is less of a difference in impedance at different temperatures, thus resulting in lower resolution in temperature measurement. The actual frequency to be used can be selected as a trade-off of these factors, and may be in the 100-500 Hz range.

Furthermore, it is desirable to use a frequency which is naturally present as a result of the traction inverter 20 driving the motor 22. As an example, 170 Hz is a frequency which is typically within the inverter spectrum during vehicle acceleration. In this situation, while the battery pack 10 is discharging and providing significant current to the inverter 20, a ripple current, or current containing an AC component at 170 Hz, will be detectable at the cell groups 16 and can be used for impedance measurement.

Figure 3:
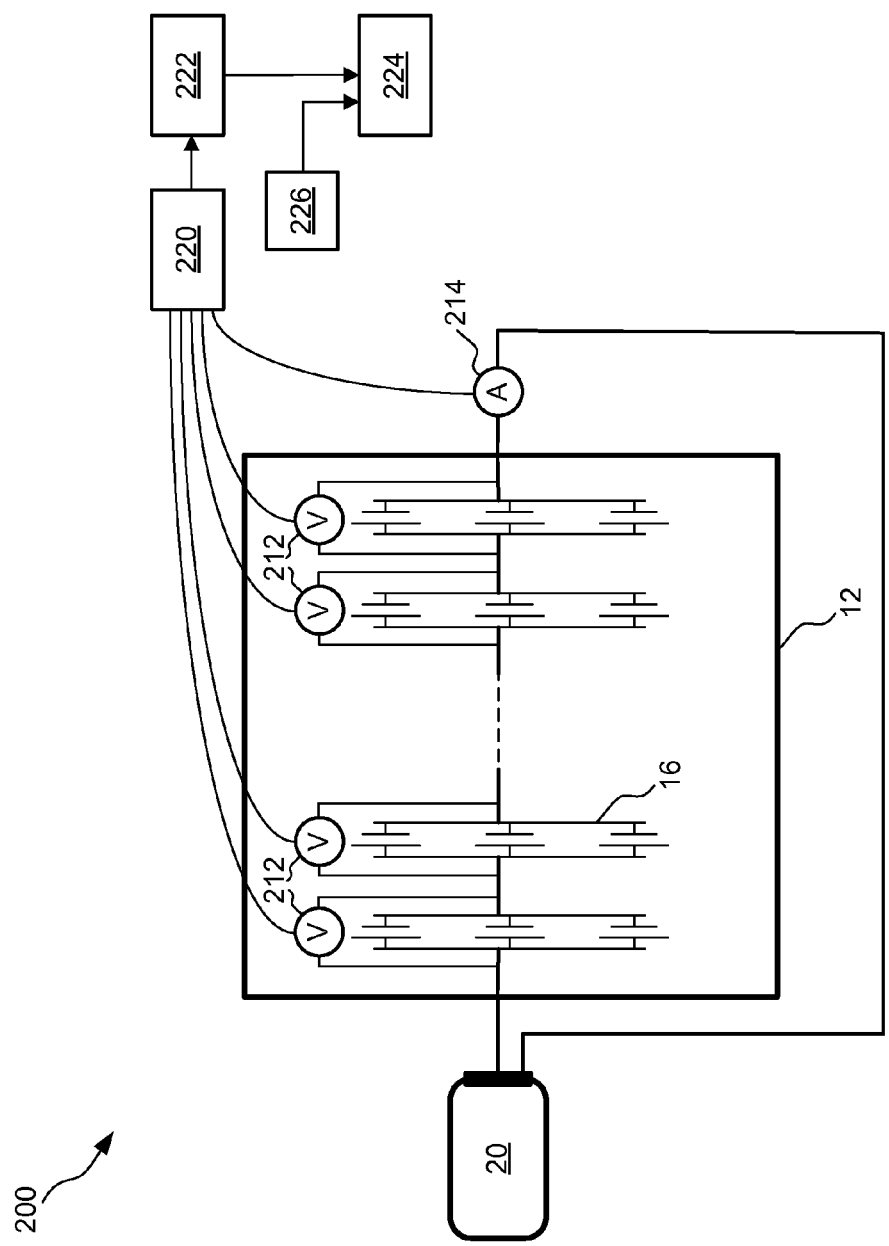
FIG. 3 is a schematic diagram of a system for determining the temperature of individual cells in a battery pack without using temperature sensors.

FIG. 3 is a schematic diagram of a system 200 for measuring impedance and determining the temperature of individual cell groups in a battery pack without using temperature sensors. Items previously shown in FIG. 1 are shown with the same reference numerals in FIG. 3. As discussed previously, the battery pack 10—of which one section 12 is shown—includes many of the cell groups 16 in series. Throughout this discussion, it is to be understood that each of the cell groups 16 can include any appropriate number of individual cells 14. That is, cell group size can range from one (individual cells 14 not grouped in parallel) to three or more.

The voltage across each of the cell groups 16 is measured with a voltage sensor 212. The voltage sensors 212 can be included in the VTSM 32, as shown in FIG. 1. The battery pack current is measured with a current sensor 214, which may be included in the VITM 30 shown in FIG. 1. The traction inverter 20 provides a ripple current, or AC voltage signal, to the battery pack 10. The AC voltage signal may be naturally occurring as a result of the inverter 20 powering the drive motor 22, or the inverter 20 may produce an artificial AC voltage signal for the sole purpose of impedance measurement.

Signals from the voltage sensors 212 and the current sensor 214 are received by a windowing module 220 and converted from analog to digital if necessary. The windowing module 220 captures simultaneous time samples of the voltage and current data, and narrows the data down to a time window of interest. The windowed voltage and current data is then provided to an FFT module 222, which performs a fast fourier transformation on the data to identify amplitudes of voltage and current at one or more specific frequencies. The output of the FFT module 222 is a voltage amplitude value for each of the cell groups 16 at a particular frequency and a current amplitude value for the battery pack 10 at the particular frequency.

The voltage and current amplitudes at the particular frequency can be used by a computation module 224 to determine the impedance of each of the cell groups 16, according to equation (1).

$$Z(\omega) = \frac{U(\omega)}{I(\omega)} \quad (1)$$

Where $Z(\omega)$ is the impedance at the frequency $\omega$, $U(\omega)$ is the voltage amplitude at the frequency $\omega$, and $I(\omega)$ is the current amplitude at the frequency $\omega$.

The computation module 224 determines the temperature of each of the cell groups 16 based on its impedance at the particular frequency using the look-up table, which also requires a state of charge value from box 226 as described previously.

In an actual implementation, the windowing module 220, the FFT module 222, and the computation module 224 may all be incorporated in the battery controller 34 shown in FIG. 1. The state of charge value and the resulting temperature value for each of the cell groups 16, can also be stored in the battery controller 34 and used for management of the battery pack 10 as appropriate.

Figure 4:
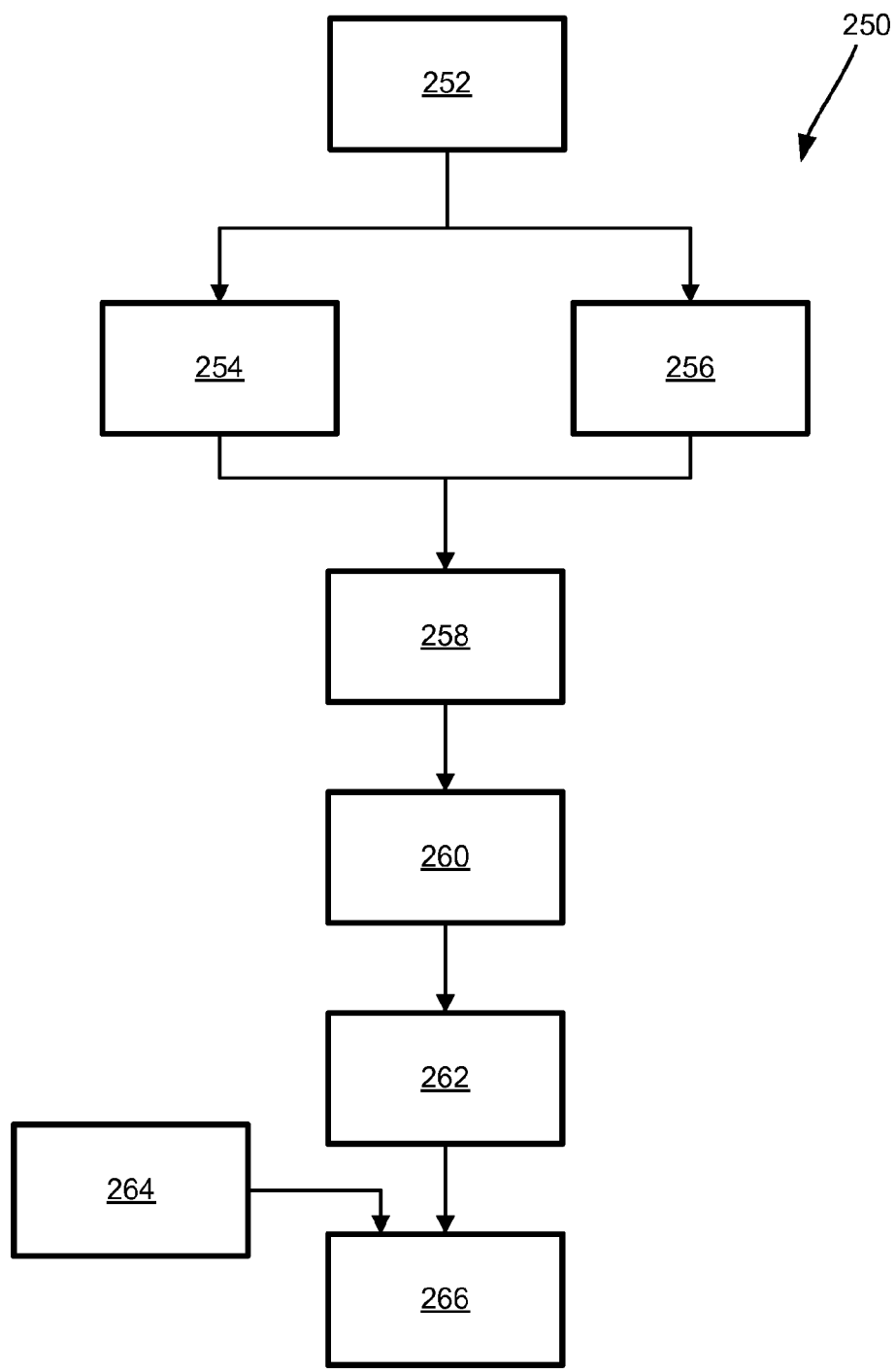
FIG. 4 is a flowchart diagram of a method for determining the temperature of individual cells in a battery pack without using temperature sensors.

FIG. 4 is a flow chart diagram 250 of a method for measuring impedance and determining the temperature of individual cell groups in a battery pack without using temperature sensors. At box 252, an AC input signal is applied to the battery pack 10, where the input signal may be naturally occurring from the traction inverter 20, or the input signal may be artificially generated. The voltage across each of the cell groups 16 and the battery pack current are simultaneously measured at boxes 254 and 256, respectively. At box 258, the voltage and current time-based data signals are clipped to a specific simultaneous time window. At box 260, a fast fourier transformation (FFT) is performed on the windowed voltage and current signals to produce a set of amplitudes at specific frequencies for each of the signals.

At box 262, an impedance value for one or more specific frequencies is computed for each of the cell groups 16, using equation (1) as described previously. At box 264, a state of charge value is provided for the battery pack 10. At box 266, the temperature of each of the cell groups 16 is determined from the look-up table 224, using the impedance value for each of the cell groups 16, the frequency value corresponding to the impedance value, and the state of charge value as input. The temperature value for each of the cell groups 16 can then be used by the battery controller 34 to assess the performance and health of the battery pack 10.

Using the method and system disclosed herein, the temperature of individual cells or cell groups in a battery pack can be determined without using temperature sensors. The elimination of the temperature sensors not only reduces cost, but also removes a potential failure mode from the vehicle. Furthermore, impedance-based temperature measurement provides temperature data for every cell or cell group in the battery pack, which is not practical with traditional temperature sensors.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A temperature measurement system for cells in a battery pack, said temperature measurement system comprising:
    means for applying an alternating current (AC) voltage signal to the battery pack;
    a voltage sensor for measuring a voltage across a cell group in the battery pack, where the cell group is comprised of one or more cells in parallel, said voltage sensor providing a voltage signal for the cell group;
    a current sensor for measuring a battery pack current, said current sensor providing a current signal for the battery pack; and
    a battery pack controller in communication with the voltage sensor and the current sensor, said controller including a processor and memory, where the controller is configured with;
    a windowing module which receives the voltage signal and the current signal and reduces the signals to a simultaneous time window;
    a fast fourier transformation (FFT) module which performs an FFT on the voltage signal and the current signal for the time window to provide voltage and current amplitudes at one or more frequencies; and
    a computation module which computes an impedance for the cell group from the voltage amplitude and the current amplitude at a chosen frequency, and uses the impedance and the chosen frequency, along with a state of charge value, to determine the temperature of the cell group.

2. The temperature measurement system of claim 1 wherein the impedance is measured and used to determine the temperature of each cell group in the battery pack.

3. The temperature measurement system of claim 1 wherein the battery pack is used in an electric or hybrid-electric vehicle.

4. The temperature measurement system of claim 3 wherein the means for applying an AC voltage signal includes a traction inverter which provides power to a drive motor.

5. The temperature measurement system of claim 4 wherein the AC voltage signal occurs naturally as a result of the traction inverter powering the drive motor.

6. The temperature measurement system of claim 4 wherein the AC voltage signal is artificially generated specifically for the purpose of impedance measurement.

7. The temperature measurement system of claim 1 wherein the battery pack controller uses the temperature of the cell group to assess performance and state of health of the cell group.

8. The temperature measurement system of claim 1 wherein the computation module uses a look-up table to determine the temperature of the cell group based on the impedance, the chosen frequency and the state of charge.

9. A battery pack system for an electric vehicle including impedance-based temperature measurement, said battery pack system comprising:
    a battery pack containing a plurality of cell groups, where each cell group is comprised of one or more cells in parallel;
    a traction inverter for providing power to a drive motor, said traction inverter also applying an alternating current (AC) voltage signal to the battery pack;
    a plurality of voltage sensors for measuring a voltage across each of the cell groups in the battery pack, said voltage sensors providing a voltage signal for each of the cell groups;

a current sensor for measuring a battery pack current, said current sensor providing a current signal for the battery pack; and a battery pack controller in communication with the voltage sensor and the current sensor, said controller including a processor and memory, where the controller is configured with;

a windowing module which receives the voltage signals and the current signal and reduces the signals to a simultaneous time window;

a fast fourier transformation (FFT) module which performs an FFT on the voltage signals and the current signal for the time window to provide voltage and current amplitudes at one or more frequencies; and a computation module which computes an impedance for each of the cell groups from the voltage amplitudes and the current amplitude at a chosen frequency, and uses the impedance and the chosen frequency, along with a state of charge value, to determine the temperature of the cell group.

10. The battery pack system of claim 9 wherein the AC voltage signal occurs naturally as a result of the traction inverter powering the drive motor.

11. The battery pack system of claim 9 wherein the AC voltage signal is artificially generated specifically for the purpose of impedance measurement.

12. A method for determining the temperature of cells in a battery pack, said method comprising:

applying an alternating current (AC) voltage signal to the battery pack;

measuring a voltage across a cell group in the battery pack and providing a voltage signal for the cell group, where the cell group is comprised of one or more cells in parallel;

measuring a battery pack current and providing a current signal for the battery pack;

reducing the voltage signal and the current signal to a simultaneous time window;

performing, using a processor, a fast fourier transformation (FFT) on the voltage signal and the current signal for the time window to provide voltage and current amplitudes at one or more frequencies;

computing, using the processor, an impedance for the cell group from the voltage amplitude and the current amplitude at a chosen frequency; and determining, using the processor, the temperature of the cell group based on the impedance and the chosen frequency, along with a state of charge value.

13. The method of claim 12 wherein the battery pack is used in an electric or hybrid-electric vehicle.

14. The method of claim 13 wherein the AC voltage signal is provided by a traction inverter which provides power to a drive motor.

15. The method of claim 14 wherein the AC voltage signal occurs naturally as a result of the traction inverter powering the drive motor.

16. The method of claim 14 wherein the AC voltage signal is artificially generated specifically for the purpose of impedance measurement.

17. The method of claim 12 further comprising using the temperature of the cell group to assess performance and state of health of the cell group.

* * * * *